United States Patent [19]
Iguchi

[11] Patent Number: 5,355,006
[45] Date of Patent: Oct. 11, 1994

[54] SEMICONDUCTOR MEMORY DEVICE WITH SOURCE AND DRAIN LIMITED TO AREAS NEAR THE GATE ELECTRODES

[75] Inventor: Katsuji Iguchi, Yamatokoriyama, Japan

[73] Assignee: Sharp Kabushiki Kaisha, Osaka, Japan

[21] Appl. No.: 201,706

[22] Filed: Feb. 25, 1994

Related U.S. Application Data

[63] Continuation of Ser. No. 928,406, Aug. 12, 1992, abandoned.

[30] Foreign Application Priority Data

Sep. 9, 1991 [JP] Japan .................................. 3-229223

[51] Int. Cl.$^5$ .............................................. H01L 29/78
[52] U.S. Cl. ................................. 257/296; 257/306; 257/386; 437/35
[58] Field of Search ............... 257/306, 296, 386, 382, 257/394; 437/35

[56] References Cited

U.S. PATENT DOCUMENTS

| | | | |
|---|---|---|---|
| 4,197,554 | 4/1980 | Meusburger et al. | 257/306 |
| 4,984,199 | 1/1991 | Yoneda et al. | 257/296 |
| 5,047,359 | 9/1991 | Nagatomo | 437/35 |

FOREIGN PATENT DOCUMENTS 64-73769  3/1989  Japan .

*Primary Examiner*—Robert Limanek
*Attorney, Agent, or Firm*—Nixon & Vanderhye

[57] ABSTRACT

A semiconductor memory device comprises a semiconductor substrate, a plurality of memory cells each comprised of a cell transistor having at least a pair of source and drain regions formed in the semiconductor substrate and a gate electrode formed thereon, a bit line, a bit contact for providing contact between the drain region and the bit line, a capacitor and a storage contact for providing contact between the source region and the capacitor, in which the pair of source and drain regions are disposed in limited areas near the gate electrode and independent form not sharing those in other memory cells.

9 Claims, 4 Drawing Sheets

SEMICONDUCTOR MEMORY DEVICE WITH SOURCE AND DRAIN LIMITED TO AREAS NEAR THE GATE ELECTRODES

This is a continuation of application Ser. No. 07/928,406, filed Aug. 12, 1992, now abandoned.

FIELD OF THE INVENTION

The present invention relates to a semiconductor memory device and a fabrication method therefor, and more specifically it relates to an improved transistor structure for dynamic random access memory (DRAM).

RELATED ART

A MOS transistor, which constitutes a memory cell of a DRAM, is fabricated by sequentially forming a device isolation region, gate electrode, and source/drain regions by ion implantation. In a peripheral circuit region composed of CMOS, BiCMOS or the like around the MOS transistor, there exist transistors of different conductivity types, for example, nMOSFET vs. pMOSFET. Accordingly, when ion implantation is carried out to form a transistor of one conductivity type, that of the other conductivity type should be covered with resist to prevent from being implanted with ions of an undesired conductivity type. To prevent channeling phenomenon, ions are usually implanted at an incident angle of about 7° with respect to a normal line to the face of a Si substrate 1 as shown in FIG. 8. Since this implantation is conducted while rotating the substrate 1, whole active regions except for regions beneath gate electrodes 3,3a are implanted with ions to form source/drain regions 4 and 5, as shown in FIG. 7.

There has been proposed an improved cell transistor structure and a fabrication method therefor to inhibit short channel effects. In such a transistor structure the source and drain regions are disposed offset to each other with intervention of a gate electrode so as to have a channel length as long as possible by covering part of a cell transistor region with resist when subjected to ion implantation. With this structure the n-type diffusion region connected to a capacitor electrode is substantially confined by the provision of a resist pattern; thus contributing to down scaling. In addition, post-examinations have revealed that the transistor structure favors reduction of leakage current at the capacitor electrode while in contrast raising a problem that the area of n-type diffusion region greatly depends on the precision of resist pattern alignment.

In association with ion implantation for forming source/drain regions of a MOS FET, particularly phosphorusion implantation for forming a low concentration region of a nMOS, there has been proposed an oblique ion implantation such as to implant ions at an incident angle of a dozen degrees to several tens degrees to reduce hot carrier effect, thereby extending a life span of the MOS FET. With this method a wafer is made to rotate continuously or stepwise to impart the same effect to transistors oriented in different directions in the wafer. Accordingly, one transistor is implanted with ions from different directions, with the result that the channel thereof is undesirably shortened.

To reduce power loss in a stand-by state of a DRAM, electric charge stored in a cell capacitor needs to be retained for as long a time as possible to increase the time interval from one refresh operation to another. To this end leakage current in the cell capacitor must be reduced. Since most of leakage current occurs at a pn junction to which one of the capacitor electrodes is connected, attempts are now being made to reduce leakage current thereat.

SUMMARY OF THE INVENTION

The present invention has been attained in view of the foregoing and is to provide a semiconductor memory device of novel structure and a fabrication method therefor.

Thus, the present invention provides a semiconductor memory device comprising a semiconductor substrate, a plurality of memory cells each comprised of a cell transistor having at least a pair of source and drain regions formed in the semiconductor substrate and a gate electrode formed thereon, a bit line, a bit contact for providing contact between the drain region and the bit line, a capacitor and a storage contact for providing contact between the source region and the capacitor, in which the pair of source and drain regions are disposed in limited areas near the gate electrode and independent form not sharing those in other memory cells.

The invention also provides a method for fabricating a semiconductor memory device provided with a semiconductor substrate, a plurality of memory cells each comprised of a cell transistor having at least a pair of source and drain regions formed in the semiconductor substrate and a gate electrode formed thereon, a bit line, a bit contact for providing contact between the drain region and the bit line, a capacitor and a storage contact for providing contact between the source region and the capacitor, in which the pair of source and drain regions are disposed in limited areas near the gate electrode and independent form not sharing those in other memory cells, said method comprising forming the source region and the drain region of the cell transistor only in limited areas near the gate electrode of the cell transistor, respectively by a two-directional oblique ion implantation utilizing a shadowing effect caused by gate electrodes adjacent said gate electrode.

In the two-directional oblique ion implantation as used in the invention, ions are implanted obliquely in two directions at predetermined angles with respect to the longitudinal axis of the gate electrode and at the same incident angle with respect to the substrate surface.

DETAILED DESCRIPTION OF THE PREFERRED EMBODIMENTS

Figure 1:
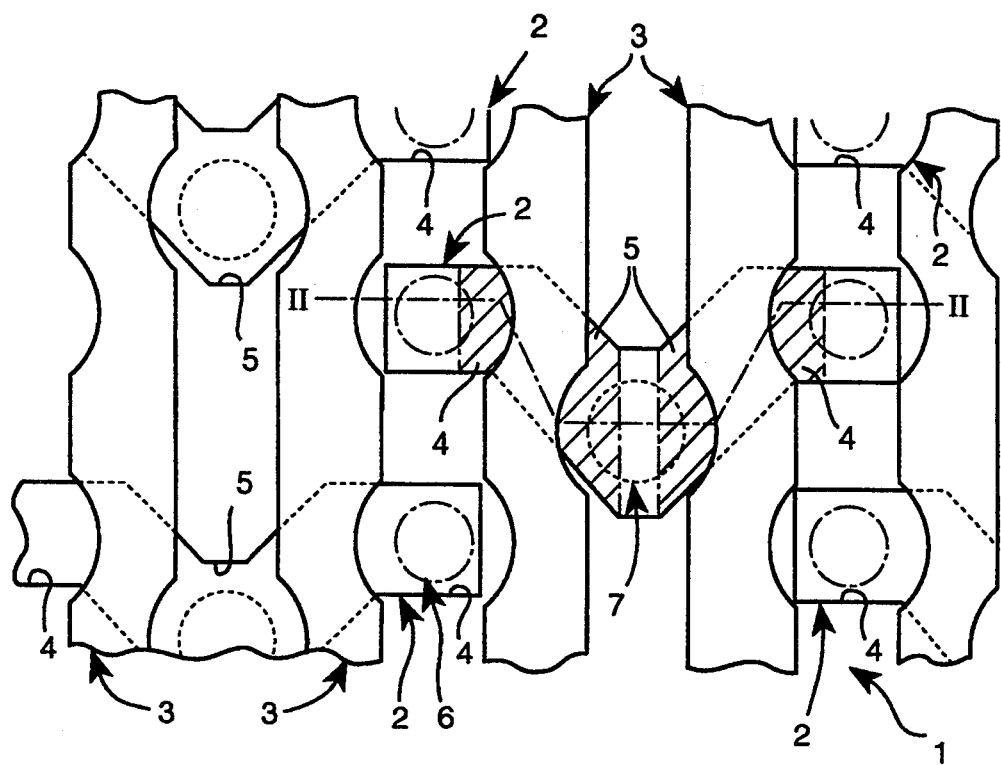
FIG. 1 is a partial plan view schematically illustrating a structure of a semiconductor memory device according to a first embodiment of the invention.

The invention is directed to a semiconductor memory device having MIS transistors on a semiconductor substrate wherein diffusion regions as source/drain are formed in only limited areas near a gate electrode associated therewith. Such a configuration of the MIS transistor can be implemented by forming the diffusion regions as source/drain with the two-directional oblique ion implantation utilizing shadowing effect caused by gate electrodes adjacent the associated gate electrode. In the two-direction oblique ion implantation as used in the invention, ions are implanted obliquely in two directions at predetermined angles with respect to the longitudinal axis of the gate electrode and at the same incident angle with respect to the substrate surface. The predetermined angles and the incident angle should be appropriately selected so as to form the diffusion regions only in limited areas near the associated gate electrode. That is, a set of source/drain regions is not shared by adjacent transistors.

By virtue of the above configuration, the area of the diffusion regions is substantially restricted as compared with that in a prior art memory device in which an active region having a cell transistor is almost entirely occupied by diffusion regions. This results in reduced junction area and therefore leads to reduction in junction capacitance and junction leakage current.

The invention is also directed to a semiconductor memory device having MIS transistors on a semiconductor substrate wherein diffusion regions are formed only in limited areas near a gate electrode associated therewith, respectively, which areas are located offset to each other with intervention of the associated gate electrode. Such a configuration of the MIS transistor can be implemented by forming the diffusion regions as source/drain with the two-directional oblique ion implantation utilizing shadowing effect caused by gate electrodes and a mask pattern which exist adjacent the associated gate electrode. In the two-directional oblique ion implantation as used in the invention, ions are implanted obliquely in two directions. More specifically, they are implanted in two directions at angles substantially normal to the longitudinal axis of the gate electrode and at the same incident angle with respect to the substrate surface. In addition by forming an appropriate mask pattern in the vicinity of the associated gate electrode prior to the implantation, the diffusion regions as source/drain can be located offset to each other with intervention of the associated gate electrode. Such a configuration can contribute to decrease in short-channel effect of the cell transistor and parasitic capacitance of a bit line as well as to reduction of junction area.

The invention is further directed to a semiconductor memory device having MIS transistors, wherein in addition to the features of the above configuration, diffusion regions are not extending over the device isolation region undesirably. Such a configuration can be implemented by providing prior to implantation a mask pattern so shaped as to cover an area adjacent a word line which exists in the device isolation region, does not constitute a cell transistor and serves only as a wiring line. Thus, such an area is not ion-implanted. In addition the area of the diffusion regions serving as source/drain can be substantially reduced, thereby contributing to a significant decrease in junction leakage current at ends of the device isolation region, which leakage current accounts for the major part of total leakage current.

In the present invention although the semiconductor substrate is not particularly limited, usually it is made of any material for semiconductor memory devices, for example, silicon substrate. The cell transistor formed on the semiconductor substrate is usually of a MIS structure. The gate electrode may be formed from any known electrode material, for example, polysilicon, silicide or polycide, and which thickness is not particularly limited. The impurity-diffusion regions serving as source/drain can be formed by implanting p-type ions, such as boron ions, or n-type ions, such as phosphorus or arsenic ions at a usual acceleration energy in a usual dose. The implantation angle, or incident angle should be appropriately selected depending on the height of the gate electrode, area of the source/drain regions intended and the like.

Henceforth, the preferred embodiments of the invention will be described in greater detail with reference to the drawings.

EMBODIMENT 1

FIG. 1 illustrates an example of memory cell arrangement constituting a DRAM. Although in the present embodiment a cell transistor is formed of a n-MOSFET, it may be of a p-MOSFET. Word lines, constituting gate electrodes of cell transistors, are usually arranged in rows and do not cross each other on a DRAM chip. The memory cell arrangement in FIG. 1 incorporates a Si substrate 1, a V-shaped active region 2, a gate electrode 3 as a word line, a source-side active region (n-source) 4, a drain-side active region (n-drain) 5, a storage contact 6 and a bit contact 7.

Figure 2:
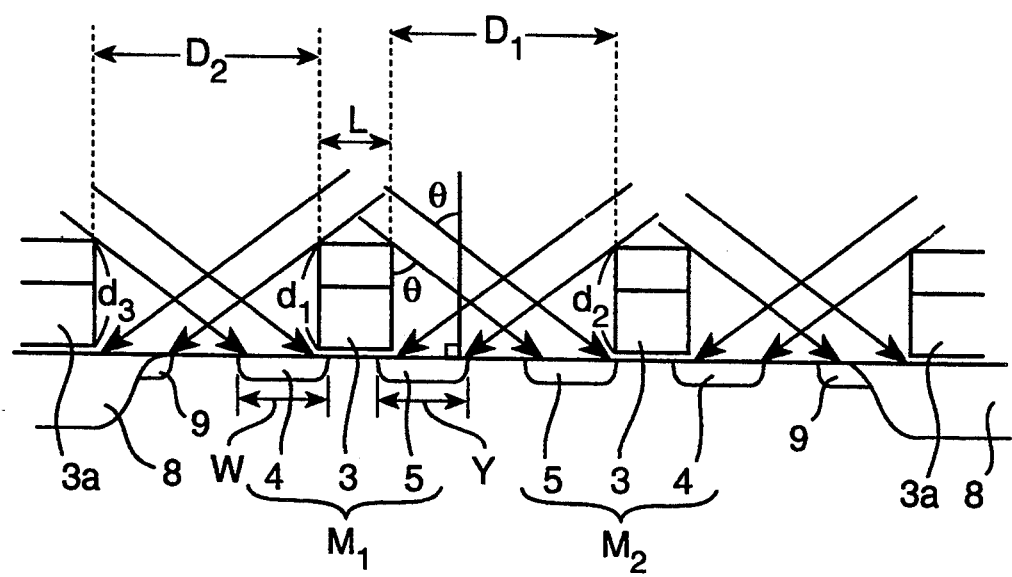
FIG. 2 is a schematic section taken along line II—II of FIG. 1.

FIG. 2 illustrates how ion implantation is carried out to form source/drain regions of a cell transistor. In FIG. 2 depicted are a device isolation region 8, a word line 3a which merely serves as a wiring line and does not constitute a cell transistor, and an unnecessary n-type diffusion region 9 which is formed near the word line 3a.

As shown in FIG. 2, in the V-shaped active region 2 provided are two MOS transistors $M_1$ and $M_2$ each comprising a gate electrode 3 and source/drain region 4,5 disposed only in limited areas near the gate electrode 3 which face opposite to each other with intervention of the gate electrode 3. The MOS transistors $M_1$ and $M_2$ do not share the drain region 5 and so are independently present in the active region 2. In order to form the transistors $M_1,M_2$ in one V-shaped active region 2, employed is a two-directional oblique ion implantation with the incident angle appropriately selected. By this method ions can be implanted only in limited areas near a certain gate electrode owing to shadowing effect caused by two gate electrodes adjacent thereto.

Specifically, as shown in FIG. 2, a source region 4 and a drain region 5 associated with the gate electrode 3 are formed in the following manner. N-type ions are implanted in two directions at predetermined angles with respect to the longitudinal axis of a word line 3 and at the same incident angle $\theta$ determined in view of the height of and space between the word lines 3,3 so as to implant ions only in limited areas near gate electrodes. For instance, assuming that a width L of individual gate electrodes is 0.3 μm, a height $d_1$ to $d_3$ thereof is 0.3 μm and a space both $D_1$ and $D_2$ between adjacent gate electrodes is 0.6 μm, the predetermined angles is preferably in the range of 80°–100°, more preferably 90°, the incident angle $\theta$ is preferably in the range of 45°–60°. It should be noted that a storage contact 6 and a bit contact 7 to be formed later need to overlap the source region 4 and the drain region 5, respectively. In this way formed for each gate are the n-type source region 4 having a width W of 0.1–0.3 μm and the n-type drain region 5 having a width Y of 0.1–0.3 μm.

According to the present embodiment, the diffusion regions as source and drain of a transistor can be self-alignedly formed only in limited areas near the gate electrode associated therewith by the two-directional oblique ion implantation utilizing shadowing effect caused by gate electrodes adjacent the aforesaid gate electrode, whereas a usual implantation makes the entire active region into n-type diffusion region. This results in a substantially reduced area of the n-type diffusion region, therefore contributing to decreased leakage current in the cell capacitor. In addition once the incident angle is determined in view of the height of the word lines and the like, instability in area and location of the n-type diffusion region to be formed can be avoided by virtue of the self-alignment based on the shadowing effect.

It should be noted that diffusion regions for the transistors $M_1$ and $M_2$ existing in the same active region can be formed simultaneously or separately by forming an appropriate resist pattern.

EMBODIMENT 2

The subject embodiment differs from Embodiment 1 in that a resist pattern as a mask against ion implantation is provided so that source/drain regions of a cell transistor may be disposed in only limited areas located offset to each other with intervention of a word line. Other features of this embodiment are common to Embodiment 1.

Figure 3:
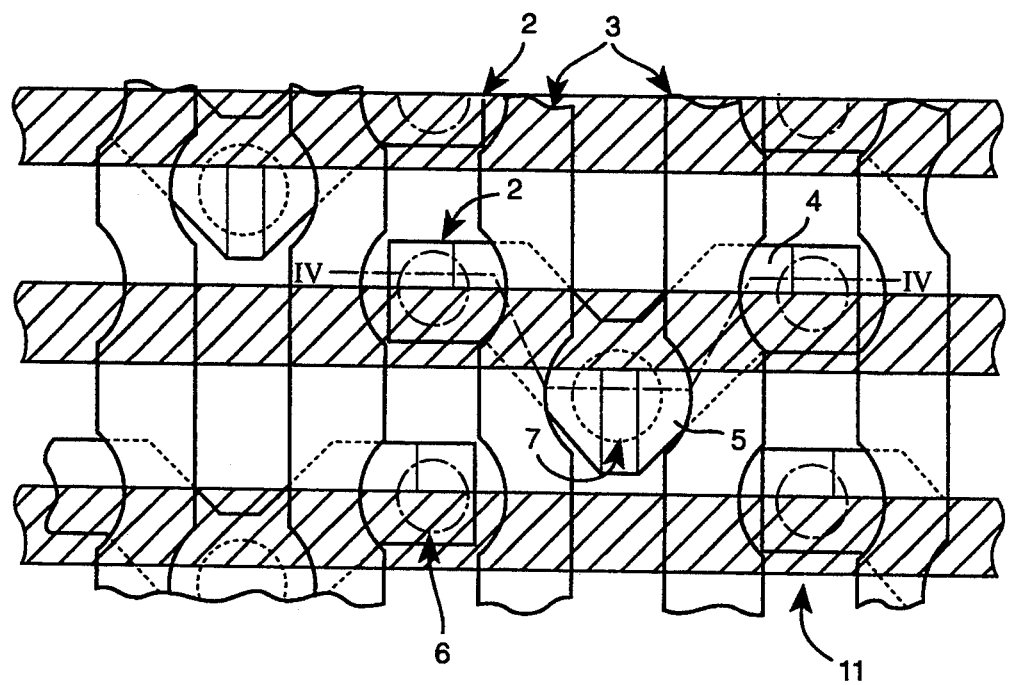
FIG. 3 is a partial plan view schematically illustrating a structure of a semiconductor memory device according to a second embodiment of the invention.
Figure 4:
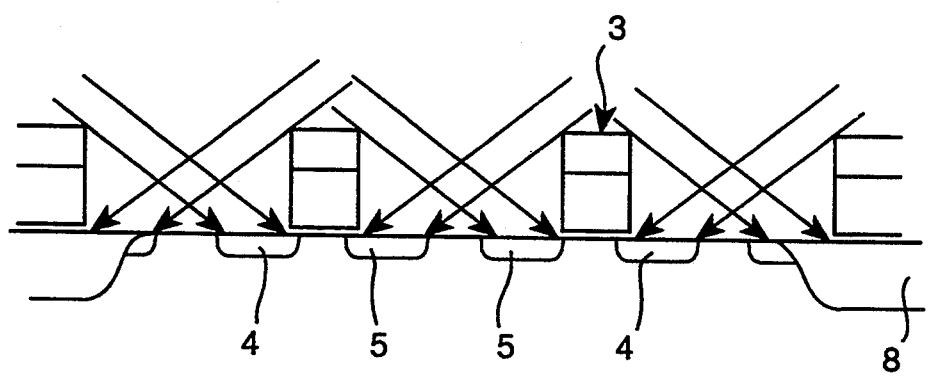
FIG. 4 is a schematic section taken along line IV—IV of FIG. 3.

FIG. 3 illustrates a memory cell arrangement for constituting a DRAM according to Embodiment 2, and FIG. 4 illustrates how ion implantation is carried out to form source/drain regions 4 and 5 of a cell transistor. Ions need to be implanted according to the two-directional oblique ion implantation as in Embodiment 1. If ions are implanted in other directions at a relatively large angle, they are blocked by a resist pattern 11 and hence cannot reach the substrate 1. Regions other than the cell region may be covered with resist so as to be shielded from this implantation or not covered with the same so as to be implanted simultaneously with the cell region. The incident angle $\theta$ needs to be determined so that ions can be implanted only in limited areas near gate electrodes, for instance, if conditions are the same in Example 1, the incident angle is preferably in the range of 45°–60°. In addition a storage contact 6 of a capacitor and a bit contact 7 of a bit line need to overlap the source region 4 and drain region 5, respectively.

Unlike the usual implantation which makes the entire active region into a n-type diffusion region, the two-directional oblique ion implantation as described above makes it possible to self-alignedly form n-type diffusion regions only in limited areas near the word line, while at the same time such diffusion regions can be located offset to each other with intervention of the word line. This results in a reduced area for n-type diffusion regions, therefore contributing to substantially decreased leakage current in the cell capacitor. Furthermore, the offset arrangement of the diffusion regions with intervention of the word line, which means that a sufficiently long channel can be assured, enables inhibiting of short channel effect and effectively reduce parasitic capacitance of a bit line.

EMBODIMENT 3

The subject embodiment differs from Embodiment 2 in that a resist pattern as a mask against ion implantation is shaped to cover an area adjacent a word line which exists in the device isolation region, does not constitute a cell transistor and serves only as a wiring line. Other features of this embodiment are common to Embodiment 2.

Figure 5:
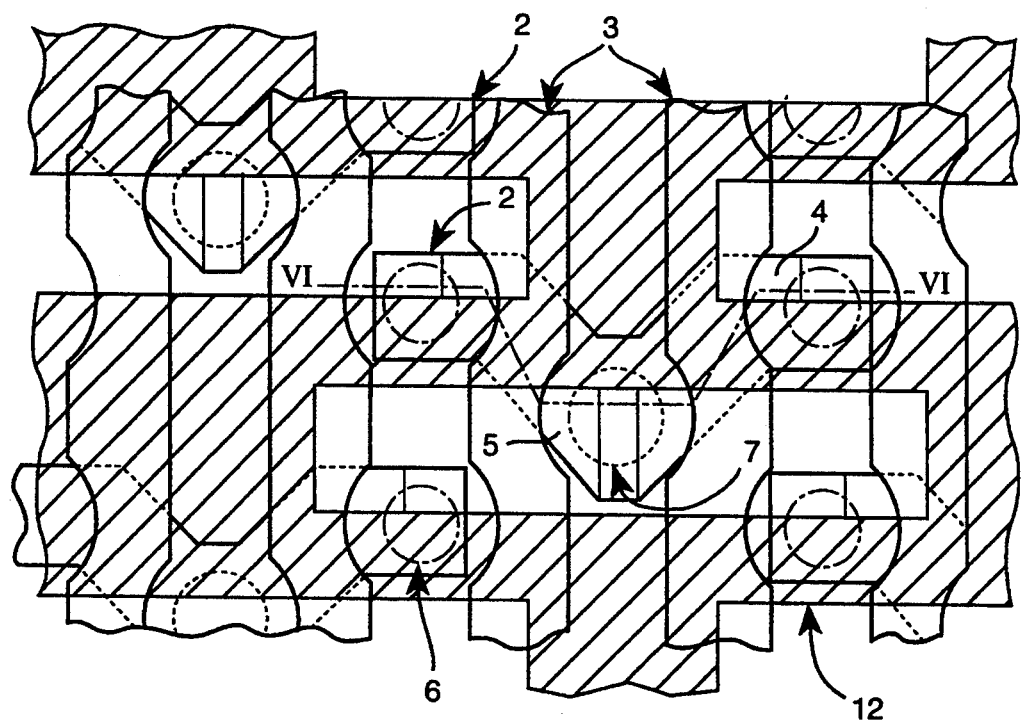
FIG. 5 is a partial plan view schematically illustrating a structure of a semiconductor memory device according to a third embodiment of the invention.
Figure 6:
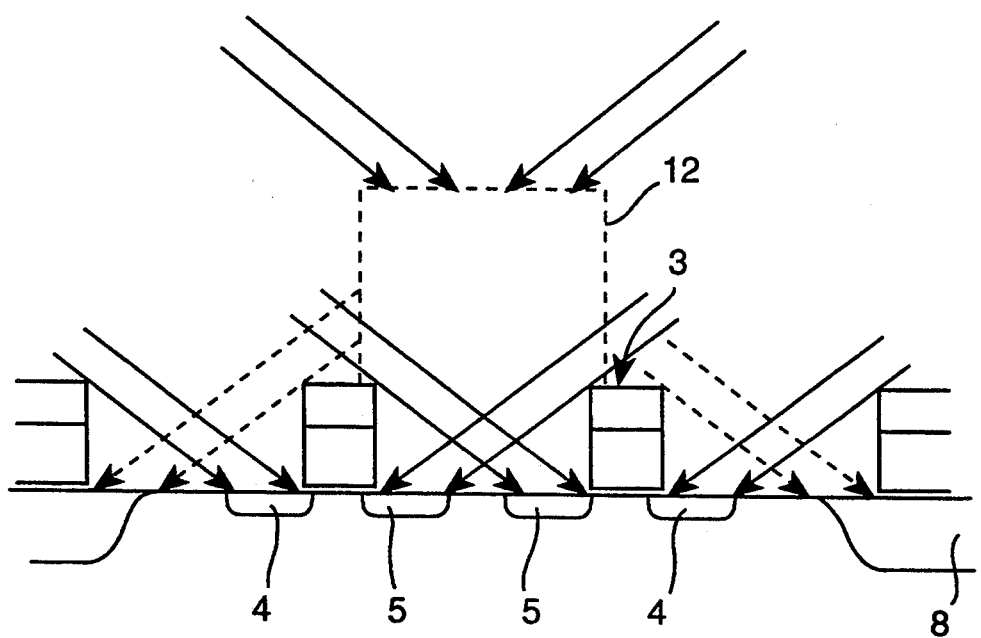
FIG. 6 is a schematic section taken along line VI—VI of FIG. 5.
Figure 7:
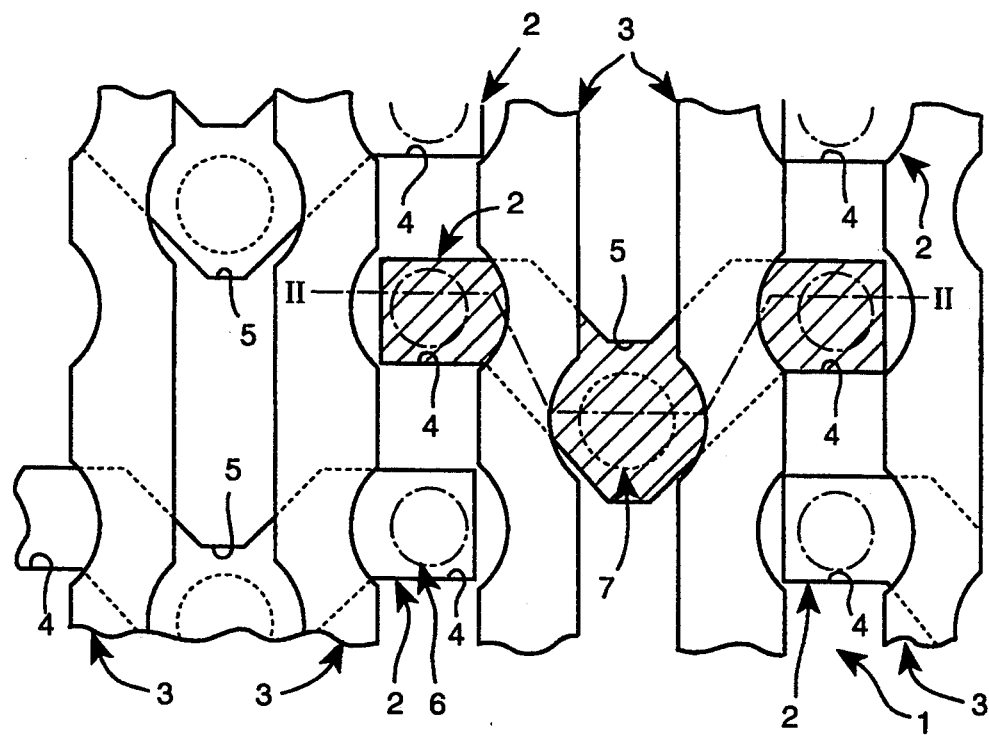
FIG. 7 is a partial plan view schematically illustrating a structure of a prior art semiconductor memory device.
Figure 8:
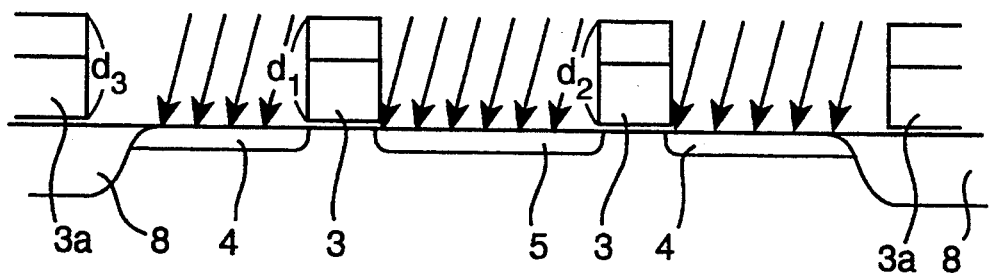
FIG. 8 is a schematic section taken along line II—II of FIG. 7

FIG. 5 illustrates a memory cell arrangement for constituting a DRAM according to Embodiment 3, and FIG. 6 illustrates how ion implantation is carried out to form source/drain regions 4 and 5 of a cell transistor. Ions need to be implanted in two direction at angle substantially normal to the longitudinal axis of a word line and at the same incident angle appropriately determined in view of the height of word lines and the like. If ions are implanted in other directions at a relatively large incident angle, or 20° or more, they are blocked by a resist pattern 12 as a mask and hence cannot reach the substrate 1. In this case regions other than the cell region may be covered with resist so as to be shielded from this implantation or not covered with the same so as to be implanted simultaneously with the cell region. The incident angle $\theta$ needs to be determined so that ions can be implanted only in limited areas near a gate electrode which are located offset to each other with intervention of the gate electrode. In addition a storage contact 6 of capacitor and a bit contact 7 of bit line need to overlap the source region 4 and drain region 5, respectively.

In Embodiments 1 and 2 an unnecessary diffusion region 9 is formed because ions are implanted in a region in the vicinity of a word line that does not constitute a cell transistor and serves only as a wiring line, whereas in Embodiment 3 such a region is shielded with the resist pattern 12 and hence ions are implanted only in the regions serving as source 4 and drain 5. Accordingly, the process according to Embodiment 3 is more effective than the other two.

Unlike the usual implantation which makes the entire active region into a n-type diffusion region, the two-directional oblique ion implantation with use of a specially shaped mask pattern according to Embodiment 3 makes it possible to self-alignedly form n-type diffusion regions only in limited areas near a word line associated therewith, while at the same time such diffusion regions can be located offset to each other with intervention of the associated word line. This results in a reduced area for n-type diffusion regions, therefore contributing to substantially decreased leakage current in the cell capacitor. Furthermore, the offset arrangement of the diffusion regions with intervention of a word line, which means that a sufficiently long channel can be assured, enables the inhibiting of short channel effects and effectively reduces parasitic capacitance of a bit line.

According to the present invention, use of the two-directional oblique ion implantation with the incident angle appropriately determined makes it possible to self-alignedly form source and drain regions only in limited areas near a gate electrode associated therewith, thereby substantially reducing the area of the source and drain regions and leakage current in a cell capacitor, thus contributing to formation of a DRAM of a longer time interval between refreshing operations. In addition device instability depending on the alignment precision of mask can be significantly reduced. Particularly, formation of an appropriately shaped mask prior to the two-directional oblique ion implantation enables substantially reducing the area of junction while at the same time inhibiting short-channel effect and decreasing parasitic capacitance of a bit line.

While only certain presently preferred embodiments have been described in detail, as will be apparent with those familiar with the art, certain changes and modifications can be made without departing from the scope of the invention as defined by the following claims.

What is claimed is:

1. A semiconductor memory device comprising
a semiconductor substrate having isolation regions,
a plurality of memory cells each comprised of
   a cell transistor having at least a pair of source and drain regions formed in the semiconductor substrate and a gate electrode formed thereon,
   a region between at least either source or drain of the pair of source and drain regions and the isolation regions having the same conductivity as the substrate, said source and drain regions being separated from the isolation region at end portions thereof which are located furthermost from the gate electrode,
   a bit line,
   a bit contact for providing contact between the drain region and the bit line,
   a capacitor and
   a storage contact for providing contact between the source region and the capacitor, in which the pair of source and drain regions are disposed in limited areas near the gate electrode so as to be spaced from said isolation regions and in an independent form not sharing the source or drain regions in other memory cells.

2. A semiconductor memory device of claim 1 in which said gate electrode has a longitudinal axis and the source region and the drain region in the pair of source and drain regions are further limited so as to be located offset to each other with respect to the longitudinal axis of the gate electrode with intervention of the gate electrode between said source and drain regions.

3. A method for fabricating a semiconductor memory device as claimed in claim 1 which comprises forming the source region and the drain region of the cell transistor only in limited areas near the gate electrode of the cell transistor, respectively by a two-directional oblique ion implantation utilizing a shadowing effect caused by gate electrodes adjacent said gate electrode.

4. A method of claim 3, wherein said two-directional oblique ion implantation comprises implanting ions in two directions at predetermined angles with respect to the longitudinal axis of the gate electrode and at the same incident angle with respect to the substrate surface.

5. A method of claim 3 which comprises forming with use of a mask pattern the source region and the drain region of the cell transistor only in limited areas near the gate electrode which are located offset to each other with intervention of the gate electrode by a two-directional oblique ion implantation utilizing a shadowing effect caused by gate electrodes adjacent said gate electrode and the mask pattern, whereby forming the device in which the source region and the drain region in the pair of source and drain regions are further located offset to each other with intervention of the gate electrode.

6. A method of claim 5, wherein said two-directional oblique ion implantation comprises implanting ions in two directions at angles substantially normal to the longitudinal axis of the gate electrode and at the same incident angle with respect to the substrate surface.

7. A semiconductor memory device as in claim 1 wherein said region between at least either source or drain of the pair of source and drain regions has the same impurity concentration as the substrate.

8. A semiconductor memory device as in claim 1 wherein two cell transistors are formed in V-shaped active regions of said substrate and the two cell transistors do not share a common source or drain region so that the transistors are independently present in said active regions.

9. A semiconductor memory device as in claim 8 wherein each said transistor has a gate electrode having a longitudinal axis and the source and drain regions of each transistor are further limited so as to be located offset to each other with respect to the longitudinal axis of the gate electrode.

* * * * *